United States Patent [19]

Zander et al.

[11] Patent Number: 5,084,300
[45] Date of Patent: Jan. 28, 1992

[54] APPARATUS FOR THE ABLATION OF MATERIAL FROM A TARGET AND COATING METHOD AND APPARATUS

[75] Inventors: Willi Zander, Jülich; Bernd Stritzker, Linnich; Joachim Fröhlingsdorf, Leverkusen, all of Fed. Rep. of Germany

[73] Assignee: Forschungszentrum Jülich GmbH, Jülich, Fed. Rep. of Germany

[21] Appl. No.: 517,635

[22] Filed: May 2, 1990

[30] Foreign Application Priority Data

May 2, 1989 [DE] Fed. Rep. of Germany ....... 3914476

[51] Int. Cl.$^5$ .................. B05D 3/06; C23C 14/00; B05B 5/00; H01B 12/00
[52] U.S. Cl. .................................. 427/53.1; 427/42; 118/620; 118/641; 118/50.1; 505/1; 505/732
[58] Field of Search .......... 427/53.1, 42; 118/50.1, 118/620, 726, 727, 730, 641; 156/643; 219/121.6, 121.66, 121.65; 505/1, 732

[56] References Cited

U.S. PATENT DOCUMENTS

| | | | |
|---|---|---|---|
| 3,538,298 | 11/1970 | Duston et al. | 219/121.6 |
| 4,065,656 | 12/1977 | Brown et al. | 219/121.6 |
| 4,200,382 | 4/1980 | Friedman | 219/121.6 |
| 4,281,030 | 7/1981 | Silfvast | 427/53.1 |
| 4,304,978 | 12/1981 | Saunders | 219/121.6 |
| 4,427,723 | 1/1984 | Swain | 118/50.1 |
| 4,566,936 | 1/1986 | Bowlin | 427/53.1 |
| 4,701,592 | 10/1987 | Cheung | 427/53.1 |
| 4,816,293 | 3/1989 | Hiramoto et al. | 427/53.1 |
| 4,874,741 | 10/1989 | Shaw et al. | 427/53.1 |
| 5,015,492 | 5/1991 | Venkatesan et al. | 427/53.1 |
| 5,019,552 | 5/1991 | Balooch et al. | 505/732 |

OTHER PUBLICATIONS

Bartholomew et al., "Low Temp. Syn. of High-$T_c$ Superconductor Thin Films by Laser Assisted Reactive Dep.", pp. 81–84, *High-T-Superconducting II;* ed. Capone et al.

Burton et al., "Laser Dep. of $YBa_2Cu_3O_{7-\delta}$ Thin Films", ed. Harper et al., *American Vac. Sec. Series* 3, pp. 166–173.

Lynds et al., "Superconduct. Thin Films of (RE) $Ba_2Cu_3(Ag)O_{7-x}$ Prep. by Pulsed Laser Ablation", ed. Brodsky et al., *High-T-Superconduct.,* pp. 707–710.

Lynds et al., "High-$T_c$ Superconductor Thin Films prep. by Pulsed Nd: 1/46 Laser Ablation", *Amer. Vac. Soc. Series* 3, ed. Harper et al., pp. 159–165.

*Primary Examiner*—Shrive Beck
*Assistant Examiner*—Marianne L. Padgett
*Attorney, Agent, or Firm*—Herbert Dubno

[57] ABSTRACT

A rotating cylindrical target has material ablated therefrom by a laser beam trained to contact the surface along a line parallel to the rotation axis, thereby avoiding problems of crater formation which arise with disc-shaped targets.

2 Claims, 1 Drawing Sheet

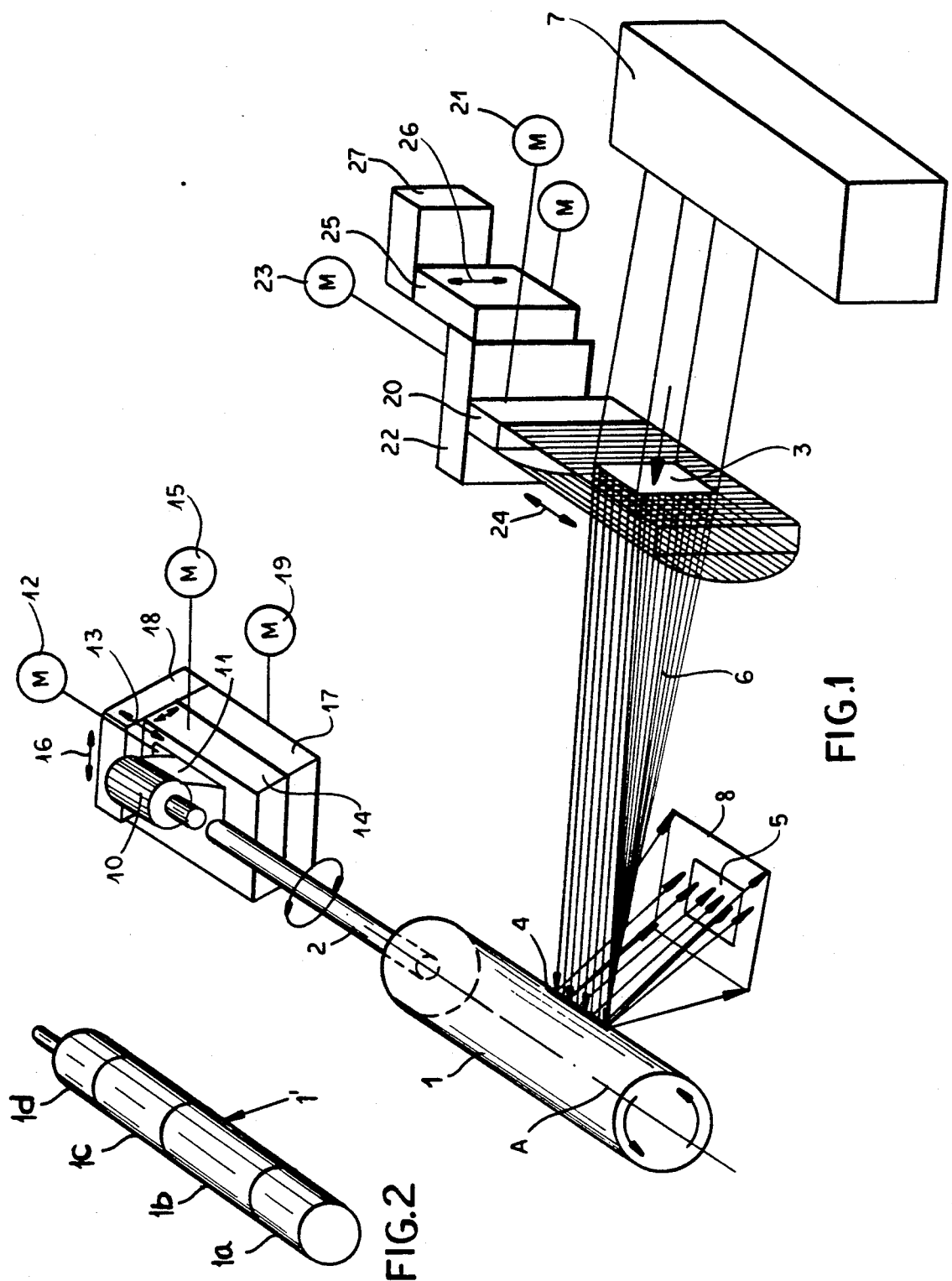

APPARATUS FOR THE ABLATION OF MATERIAL FROM A TARGET AND COATING METHOD AND APPARATUS

CROSS REFERENCE TO RELATED APPLICATION

This application is related to the commonly assigned copending application Ser. No. 07/372 928 filed 28 June 1989 in which we, together with Ulrich Poppe, were named as inventors.

FIELD OF THE INVENTION

Our present invention relates to an apparatus for the ablation of material from a target and to a method of and an apparatus for coating material onto a substrate, especially for the coating of a target material in stoichiometrically identical form, i.e. without change in composition, onto a substrate.

BACKGROUND OF THE INVENTION

It is known to ablate material from a target by rotating the target while directing a beam or pencil of radiation from a laser onto the target material, thereby vaporizing same.

In our above-identified copending application, an apparatus which makes use of the ablation of material from a target in this manner is described. That apparatus comprises an ultrahigh-vacuum chamber (UHV chamber) and serves for the stoichiometric reproduction of the material of the target as a coating on a substrate, i.e. the formation on a substrate of a coating at the exact composition of the target material which is used.

In that system, a plasma is generated from the target material by directing the beam from an excimer laser against the target. The rectangular beam profile is focused to a line by a cylindrical lens.

This system is able to effect relatively high coating rates with stoichiometric reproduction of the target composition. The target is rotated and the focuse laser beam is directed against the disc-shaped face of the plate-like target.

While a homogeneous ablation of material can be initially achieved in this manner, experience has shown that the method gives rise to crater formation at the target center which can reduce, on the one hand, the life of the target and on the other hand detrimentally effects the homogeneity and reproducibility of the process.

OBJECTS OF THE INVENTION

It is, therefore, an object of the invention to provide an apparatus for the purposes described which is free from the above-mentioned drawbacks.

It is another object of this invention to extend the principles of our above mentioned earlier application to systems in which the coating can be effective with all of the advantages of our earlier system but fewer drawbacks.

Still another object of the invention is to provide an improved method of and apparatus for the composition-true coating of a substrate with a target material in a homogeneous and reproducible manner.

SUMMARY OF THE INVENTION

These objects and others which will become apparent hereinafter are attained, in accordance with the invention, in an apparatus for the ablation of material from a target which comprises a cylindrical target, a rotatable holder for the target and means for directing a laser beam against the cylindrical surface of the target while rotating that surface about its cylinder axis. According to a feature of the invention, means is provided for shifting the target along the cylinder axis simultaneously with the rotation thereof. The laser beam is preferably so focused that it impinges on the surface of the target in a line parallel to the cylinder axis.

In addition, it has been found to be advantageous to provide means for laterally (axially) shifting the target. In case the target consists of more than one cylindrical part of different materials, different plasmas can be produced without breaking the vacuum. This enables production and multilayer deposits of different materials without interruption of the vacuum.

The apparatus of the invention can form part of a plasma coating apparatus as described in the aforementioned copending application which is incorporated in its entirety herein by reference. Basic to such a coating system, of course, is the substrate which may be so juxtaposed with the ablation region of the target that it is coated in a Therefore the invention provides an apparatus for coating a substrate in a composition-true manner with a layer of material and wherein the apparatus comprises:
   a target having a cylindrical surface composed of the material and a cylinder axis;
   a holder receiving the target and rotatable about the axis;
   drive means connected with the holder and rotatable about the axis;
   a laser generating a laser beam trained on surface for ablating the material from the target; and
   means for positioning a substrate in a path of material ablating from the target whereby the substrate is coated with the material.

According to the invention, therefore, a cylindrical or drum-shaped target is used which is not only rotatable about its cylinder axis during the rotation but also can be shiftable axially back and forth. The ablation of the target material is effected by laser beams or rays which are so focused that they are aligned in a line along the surface of the cylinder. This has been found to result in a uniform ablation which is free from the drawbacks of the earlier systems as described.

For most effective results, the lateral shift means is so provided that the line of ablation is practically parallel to the cylinder axis.

In processes for the coating of substrates it has been found that the optimum formation of the plasma for coating of a substrate requires that the substrate be positioned optimally with respect to the incident angle of the beams on the target and the location of the incidence.

Consequently the present invention provides a method of coating a substrate in a composition-true manner with a coating of a target material which comprises the steps of:
   rotating a target having a cylindrical surface about an axis of the surface;
   training a laser beam against the surface in an incident line shape parallel to the axis to ablate material from the surface; and
   positioning a substrate in the region of the line at a location in a path of reflection from the surface of the beam, thereby coating the substrate with the material.

Since the incident location and the incident angle are important for optimum coating, a corresponding adjustment facility is provided for the laser beam and a lateral shift is provided for the target according to the invention.

BRIEF DESCRIPTION OF THE DRAWING

The above and other objects, features and advantages of our invention will become more readily apparent from the following description, reference being made to the accompanying highly diagrammatic drawing in which:

FIG. 1 is a perspective view of an apparatus according to the invention for diagrammatically ablating a target material with a laser beam for the composition-true coating of a substrate; and FIG. 2 is a perspective view of another target which can be used in the system of FIG. 1.

SPECIFIC DESCRIPTION AND SPECIFIC EXAMPLES

The highly diagrammatic drawing shows a drum-type (cylindrical) target 1 carried by a rotatable holder 2 and rotatable about the cylinder axis A.

By means of a cylindrical lens 3 a laser beam 6 from an excimer laser source 7 (see the aforementioned application) is focused at an incident or ablation line 4 against the surface of the cylinder 1. The material from the target is thus ablated and deposited upon a substrate 5 on a substrate support 8.

As will be apparent from the drawing, the incident line 4 lies below a line connecting the center of the cylinder lens and the center of the target. The plasma formation is directed onto the complete substrate surface. This ensures optimum formation of the coating.

Using the apparatus and method otherwise described in the above mentioned copending application we can coat thin layers in a composition-true manner onto $SrTiO_3$ or $ZrO_2$ substrates of compositions of $YBa_2Cu_3O_7$, i.e. the so-called 1 2 3 superconductor, in an oxygen atmosphere utilizing a pulsed excimer laser (LAMBDA PHYSIK, EMG 201).

As can be seen from the drawing, the motor 10 which rotates the target 1 about the axis A can be mounted on a carriage 11 which is shiftable by a drive 12 as represented by the arrow 13 parallel to the axis A so that the target 1 can be moved axially back and forth to allow the ablation line 4 to additionally sweep the full length of the target.

The carriage 11 is mounted, in turn, on a cross slide 14 which can be shifted by a drive 15 adjustably in the direction of arrow 16, i.e. in a horizontal plane perpendicular to the axis A. The cross slide 14, moreover, can be provided on a support 17 which can be raised and lowered on a post 18 by the drive 19 so that the axis A can be shifted vertically in a direction perpendicular to the axis A. In other words elements 14 through 19 serve to allow adjustment of the location of the impingement line 4 along the surface of the drum.

If desired, the lens 3 and/or the laser 7 can be provided with similar adjustment means. For example, the lens 3 may be carried by a holder 20 which is shiftable by a drive 21 toward and away from the target 1 composed of $YBa_2Cu_3O_7$ and in the ultrahigh-vacuum coating chamber which has not been illustrated.

The holder 20 is mounted on a cross slide 22 displaceable by the drive 23 to shift the lens parallel to the axis in the direction of arrow 24 and the cross slide is mounted in turn on vertical slide 25 allowing adjustment in the vertical direction represented by arrow 26 on a post 27. The mechanism 20 through 27, therefore, likewise can serve to adjust the region at which the laser beam impinges on the target.

In FIG. 2 I have shown a target 1' which can be substituted for the cylindrical target of FIG. 1 and wherein four different zones of target material 1a through 1d are provided, axially offset from one another along the drum.

The means 12 for axially shifting the drum can here be used to direct the laser beam 6 against the cylindrical segments 1a through 1d in succession to deposit different materials upon the substrate in succession and to selected thicknesses, thereby forming a multilayer product. The materials which are deposited can, for example, include one or more superconductor materials which can be the same or different and one or more conductive materials or semiconductive materials as desired.

We claim:

1. An apparatus for ablating material of a composition capable of forming a oxide ceramic superconductor from a target and depositing said material in the same composition on a substrate, comprising:
   a rotatable holder defining an axis of rotation;
   means forming a cylindrical target surface centered on and surrounding said axis and mounted on said holder for rotation around said axis;
   means for rotating said holder and said target around said axis;
   means for positioning a substrate below said cylindrical target surface;
   a laser training a beam of laser radiation against a lower portion of said surface below said axis during rotation thereof to ablate target material from said surface;
   means for axially shifting said surface during ablation of target material therefrom by said laser beam; and
   cylindrical lens means elongated parallel to said axis for focusing said laser beam into an incident line at said surface parallel to said axis, said line lying below a line connecting a center of said cylindrical lens means with said axis, the coating being effected under conditions in which a plasma is formed from said material in an oxygen atmosphere.

2. A method of coating a substrate with a oxide ceramic superconductor target material of a certain composition which comprises the steps of:
   rotating a target having a cylindrical surface of said composition about an axis of said surface;
   training a laser beam against a lower portion of said surface below said axis in an incident line shape parallel to said axis to ablate material from said surface by a cylindrical lens means elongated parallel to said axis for focusing said laser beam into said incident line shape at a location on said surface lying below a line connecting a center of said cylindrical lens with said axis; and
   positioning a substrate below said surface in a region of said line at a location in a path of reflection from said surface of said beam under conditions in which a plasma is formed from said material in an oxygen atmosphere, thereby coating said substrate with said material.

* * * * *